(12) United States Patent
Tonus

(10) Patent No.: US 6,302,738 B1
(45) Date of Patent: Oct. 16, 2001

(54) CONNECTOR WITH CONDUCTIVE ELEMENTS PARTIALLY EMBEDDED IN MICROWAVE-ABSORBING MATERIAL

(75) Inventor: Serge Tonus, Brax (FR)

(73) Assignee: Alcatel, Paris (FR)

( * ) Notice: Subject to any disclaimer, the term of this patent is extended or adjusted under 35 U.S.C. 154(b) by 0 days.

(21) Appl. No.: 09/706,830

(22) Filed: Nov. 7, 2000

(30) Foreign Application Priority Data

Nov. 18, 1999 (FR) .................................................. 99 14494

(51) Int. Cl.⁷ ........................ H01R 12/00; H01R 13/648; H05K 1/00
(52) U.S. Cl. ............................................. 439/607; 439/76
(58) Field of Search ............................. 439/607, 66, 76, 439/521

(56) References Cited

U.S. PATENT DOCUMENTS 5,040,994 * 8/1991 Nakamoto et al. ..................... 439/76

FOREIGN PATENT DOCUMENTS

| 33 26 629 A1 | 1/1985 | (DE) . |
| 0 661 776 A3 | 7/1995 | (EP) . |
| 2 680 434 A1 | 2/1993 | (FR) . |

* cited by examiner

Primary Examiner—Brian Sircus
Assistant Examiner—Chandrika Prasad
(74) Attorney, Agent, or Firm—Sughrue, Mion, Zinn, Macpeak & Seas, PLLC

(57) ABSTRACT

A connector for connecting equipment housed inside an electromagnetically shielded housing to equipment outside the housing when the housing is provided with an opening in which the connector is engaged. The connector comprises conductive elements for connecting the pieces of equipment together and an electrically conductive body consisting of a single piece and filled, over at least a portion of its length, with a microwave-absorbing material in which the connection elements are embedded. The connector is pressed by means of an electrically conductive gasket against the wall of the housing, the gasket surrounding the opening in which the connector is engaged.

16 Claims, 2 Drawing Sheets

CONNECTOR WITH CONDUCTIVE ELEMENTS PARTIALLY EMBEDDED IN MICROWAVE-ABSORBING MATERIAL

The invention relates to a microwave attenuating-connector for equipment housed in an electromagnetically shielded housing. It also relates to assemblies including a housing equipped with such a connector.

BACKGROUND OF THE INVENTION

In much electronic equipment contained in housings and in particular in equipment designed for use on board satellites, it is conventional to use effective electromagnetic shielding to protect equipment or elements of RF equipment (i.e. operating at radio frequency) from potentially harmful electromagnetic signals which are capable of reaching the equipment or its more sensitive elements. It is also conventional to enclose equipment or equipment elements in a closed housing that is made of metal or that is metallized for electromagnetic shielding purposes if said equipment of equipment elements generate or are capable of generating potentially harmful electromagnetic signals which must, where necessary, be channeled in appropriate manner, or even confined as much as possible by shielding inside the housing in which they are produced or transmitted. As is known, there is a risk of electromagnetic leakage, in particular for signals corresponding to short wavelengths, e.g. shorter than 3 cm, whenever a shielded housing needs to include one or more openings, and in particular, at least one opening to enable connections to pass between the outside and the inside of the housing. Suitable shielding must thus be provided where there is the risk of leakage in order to attenuate as much as possible any leakage signals.

Shielding against intervening electromagnetic signals transmitted in the Ku and Ka microwave bands involves, for example, attenuation with a mean value of about 70 dB for conventional RF equipment in order to ensure mutual RF compatibility between the various repeaters of a satellite, for example. For example, attenuation of about 100 dB is necessary for sensitive equipment elements e.g. receivers, channel amplifiers.

As it is generally necessary to power equipment and to control it remotely from outside the housing in which it is housed, a low-frequency LF connector is generally provided for this purposes, mounted on the housing in which the equipment is housed. Such a connector includes, for example, DC power supply terminals for the equipment, and terminals for connecting wires that enable remote control and/or remote sensing signals to be transmitted. The connector closes the opening in the housing through which it penetrates and in which it is fixed more or less effectively. Unfortunately LF connectors usually have only very low effectiveness in terms of attenuation, in particular in the Ka and Ku bands. The attenuation obtained is about 10 dB, for example, whereas attenuation of about 80 dB to 100 dB is necessary.

A known solution to that problem is shown in FIG. 1. It relates to the conventional circumstance in which a shielded electromagnetic housing 1 is equipped with a connector 2 positioned in an opening made therefor in an outer wall of the housing, and in which the connector 2 selectively connects external electric connection wires LE outside the housing to internal connection wires LI housed inside the housing in order to serve equipment contained within said housing. In that known solution, the housing 1 is organized in such a manner that it includes compartments that are electromagnetically isolated from one another, e.g. 3 and 3A. This is achieved, for example, by adding an intermediate metal wall 4 with the two compartments on opposite sides of the wall. Radiofrequency feed-through filters 5 carried by the intermediate wall 4 enable connection conductors to pass between equipment elements which are not housed in the same compartment. The component elements of the equipment can thus be distributed in the compartments as a function of the level of protection necessary with regard to electromagnetic disturbances. This is shown in FIG. 1 in which the RF elements that need particular protection form an assembly 6 housed in compartment 3A and they are separated from the LF elements which form an assembly 7 and which are housed in compartment 3.

A main drawback of that known solution is that it makes the mechanical structure of the assembly which forms the equipment and its housing complicated and heavy and it substantially increases its cost, in particular in the case of equipment designed for satellites. Special manual operations are required for mounting and wiring the filters and said operations are particularly costly in the case of the application mentioned above. In addition, because of the presence of the filters, such a solution is not suitable for passing fast digital signals from one compartment to the other.

A second known solution is shown in FIG. 2. It too is designed to be used when it is necessary to intervene in an assembly in which equipment 8 is housed in a housing 1' equipped with a connector 2' which is mounted in such a manner that the level of electromagnetic protection obtained is insufficient. That solution is used more particularly in the case of an assembly that has already been made, when it is not desirable or neat possible to modify the assembly satisfactorily in order to achieve the required level of protection. Additional external shielding is envisaged in order to complete the shielding of the connector 2'. In the conventional embodiment shown, a shielding cover 9 is positioned on the electromagnetically shielded housing 1' so as to surround the portion of the connector 2' which is outside the housing 1' when the connector is in place in the housing. The shielding cover 9 thus surrounds the external connection wires LE over a limited length starting from the connector 2' to which they are connected. Over-shielding 10 must thus be provided on the harness constituted by the wires outside the cover 9. The over-shielding is connected to the cover 9 over 360° about the axis on which the harness penetrates into the cover. A conductive gasket 11 completes the shielding in the region in which the cover 9 bears on the outer wall of the housing 1'. As known, that solution is difficult to implement and it involves fiddley and lengthy manual operations, in particular for making the over-shielding on the harness. It also leads to an increase in the weight of the harness and is thus detrimental to payload in the case of equipment designed for a satellite.

OBJECTS AND SUMMARY OF THE INVENTION

The invention therefore proposes a connector, having more particularly the function of a microwave attenuator, for connecting equipment housed inside an electromagnetically shielded housing to equipment outside the housing when the housing is provided with an opening in which the connector is designed to be engaged, the connector comprising conductive elements for connecting the pieces of equipment together.

According to a characteristic of the invention, the connector comprises a hollow electrically conductive body consisting of a single piece and filled, over at least a portion of its length, with a microwave-absorbing material in which the connection elements are embedded. It also comprises a plug element on which the connection elements are mounted and by means of which the body of the connector is closed in such a manner as to provide a cavity in which said microwave-absorbing material is contained, the plug element enabling the connection elements to be held in position in the connector.

The invention also provides a housing-and-connector assembly comprising an electromagnetically shielded housing for housing equipment, and a connector for connecting said housed equipment to equipment outside the housing, the connector being a connector of the invention and including, in particular, the above-defined characteristic.

BRIEF DESCRIPTION OF THE DRAWINGS

The invention, its characteristics, and its advantages are described in the following description with reference to the figures listed below.

MORE DETAILED DESCRIPTION

Figure 1:
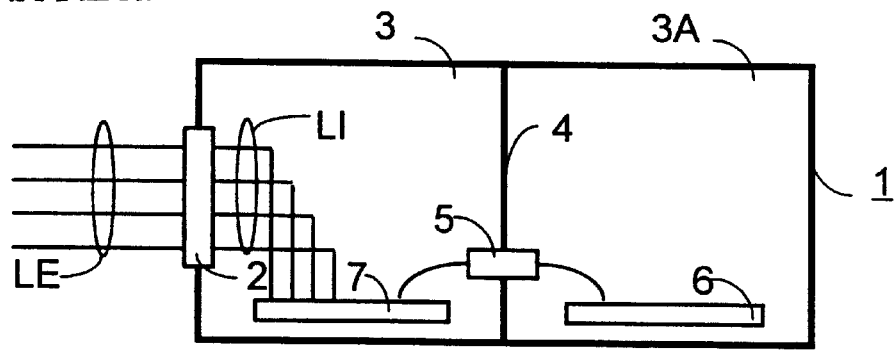
FIGS. 1 and 2 are skeleton diagrams of the two above-mentioned known examples of an electromagnetically shielded housing equipped with an LF connector and designed to house equipment.
Figure 2:
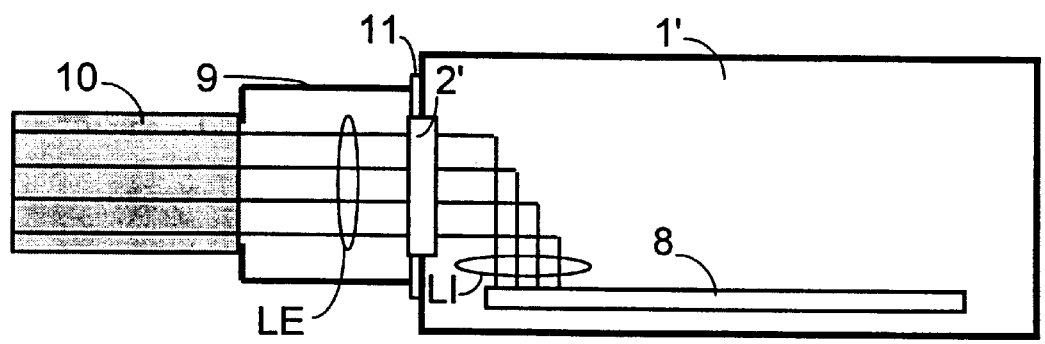
Figure 3:
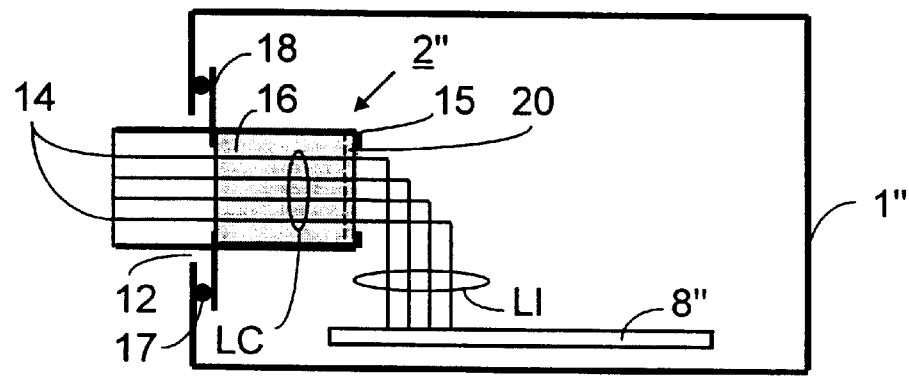
FIG. 3 is a skeleton diagram of a housing of the invention for housing equipment.

The housing 1" of electromagnetic shielding shown in FIG. 3 is provided to house equipment 8". As indicated above, the equipment either provides protection against electromagnetic disturbances and more particularly against microwave disturbances, or it provides electromagnetic isolation so as to prevent the potentially interfering signals that it generates from being transmitted in uncontrolled manner to the outside of the housing in which it is contained. As indicated above, the signals which are to be attenuated are, in particular, microwave signals and more particularly those which are situated in the Ka and Ku frequency bands, when the equipment is designed for use on board a satellite.

Figure 4:
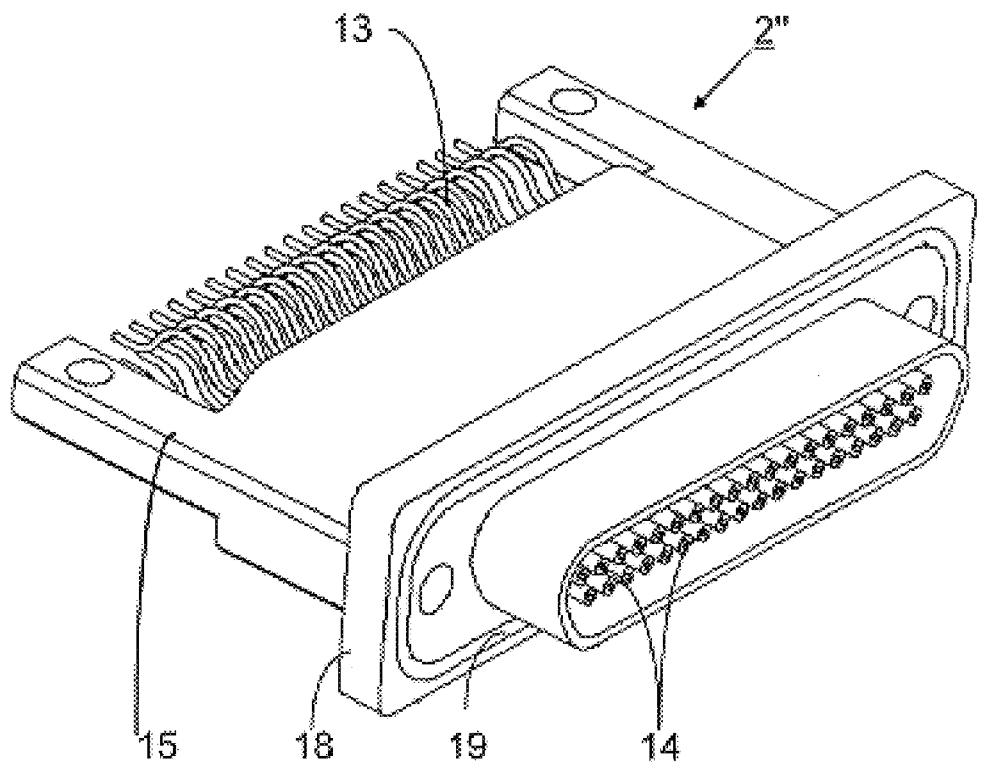
FIGS. 4 and 5 are respectively a perspective view and a section view of an example of a connector of the invention.
Figure 5:
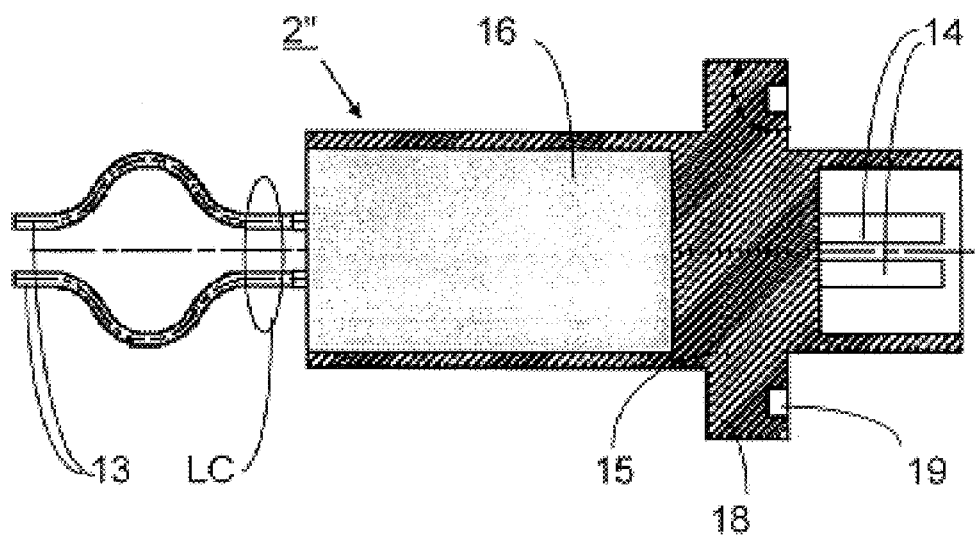

It is assumed that the housing 1" includes an opening 12 provided to enable it to receive a connector 2" which is usually fixed therein in conventional manner and not shown here. The connector 2" conventionally includes conductive connection elements LC which connect contact elements 13, situated at a first end of the connector, to other contact elements 14, situated at a second end of the connector. More particularly, the contact elements 13 and 14 are shown only in FIGS. 4 and 5. They are provided to enable the connecting wires LI situated inside the housing and connected to the equipment 8" to be connected to the connecting wires LE situated outside the housing 1", the elements 13 being designed to be inside the housing 1" when the connector 2" is in place, whereas the elements 14 are designed to be outside said housing.

In the invention, the connector 2" includes an electrically conductive body 15 consisting of a single piece that is often made of metal or that is metallized, for electromagnetic shielding purposes. The body 15 is filled, over at least a portion of its length, with an absorbent material 16, and more particularly with a microwave-absorbing material, e.g. of the epoxy resin type, or silicone filled with metal particles and molded.

The connection elements LC are embedded in the absorbent material 16 over at least a portion of their length between the contact elements 13 and 14 that they connect selectively and electrically.

In a first embodiment, the hollow body 15 and the assembly formed by the connection elements LC (that may or may not be provided with the contact elements 13 and 14 that they serve) are held in position by a temporary mounting while the connector is being made during the stage in which the said connection elements LC are embedded in the absorbent material 16 when said absorbent material is introduced in the cavity provided therefor in the hollow body. The absorbent material 16 thus ensures that once the temporary mounting has been removed, the connection elements are held in position in the body 15 of the connector 2" either by itself or by means of an additional conventional support element, not shown here.

In a variant, the assembly formed by the connection elements LC (that may or may not be provided with the contact elements 13 and 14 that they serve) is mounted on a plug element 20, e.g. a plate or a block which is positioned in determined manner in the hollow body, e.g. at one of its ends, thus ensuring that the connection and contact elements are suitably positioned in the connector. The plug element, in connection with the hollow body, thus defines the cavity in which the absorbent material 16 is introduced, e.g. by casting, and it defines the places through which the connection elements LC pass, with the connection elements being embedded therein over at least a portion of their length.

In order to limit leaks and in particular microwave leaks via the opening 12 through which the connector 2" penetrates into the housing 1", an electrically conductive gasket 17 is positioned so as to surround the opening 12 and so as to be compressed between the outer wall of the housing in which the opening is situated and a corresponding support wall of the connector 2", as can be seen in FIG. 3. In the embodiment shown here, the body 15 of the connector includes a peripheral bearing collar 18 via one face of which the connector bears against the wall of the housing in which it is mounted, around the opening 12 in which it is housed. It is assumed that the bearing face of the collar 18 includes a groove 19 designed to receive the gasket 17.

In the embodiment shown in FIG. 3, the major portion of the connector 2" is positioned inside the housing 1" from where the contact elements 14 thus project. The collar 18 thus bears via the gasket 17 against the inside wall of the housing in which the opening 12 is situated, the cavity containing the absorbent material 16 thus being positioned inside the housing together with the contact elements 13 provided for the connections coming from the protected equipment 8".

Microwave signals can be significantly attenuated by implementing a microwave-attenuating connector of the invention in a mounting as defined with reference to FIG. 3. The mounting has the advantage of avoiding the use of filters and an internal insulating wall between different elements of equipment inside a housing. It thus makes it possible to simplify the mechanical structures that are designed to equip a housing to enable it to receive equipment. The elimination of filters makes it possible both for DC signals and for digital signals to be transmitted up to relative high frequencies, e.g. about 1 GHz for digital signals, and without being deformed.

What is claimed is:

1. A connector for collecting equipment housed inside an electromagnetically shielded housing to equipment outside the housing when the housing is provided with an opening in which the connector is designed to be engaged, said connector comprising: conductive elements for connecting the pieces of equipment together, an electrically conductive body comprising a single piece and filled, over at least a portion of its length, with microwave-absorbing material in which the connection elements are embedded, and a plug element on which the connection elements are mounted and by means of which the body of the connector is closed in such a manner as to provide a cavity in which said microwave-absorbing material is contained, the plug element enabling the connection elements to be held in position in the connector, the conductive elements protruding from the microwave absorbing material at an end of the connector's electrically conductive body that inserts into the housing.

2. A connector housing according to claim 1, wherein the microwave-absorbing material also holds the connection elements in position.

3. A housing-and-connector assembly comprising an electromagnetically shielded housing for housing equipment and a connector for connecting said equipment to other equipment outside the housing, wherein the connector is a connector according to claim 1.

4. A housing-and-connector assembly according to claim 3, including electrical coupling means for coupling the housing to the connector in such a manner as to ensure electrical continuity therebetween.

5. A housing-and-connector assembly according to claim 4, wherein the coupling means comprises an electrically conductive gasket mounted between the connector and the housing in such a manner as to surround the opening.

6. A connector for electrically connecting equipment housed inside a housing to equipment outside the housing, the housing provided with an opening for mounting the connector, said connector comprising:

a connector body defining a cavity therein, the connector body having a first end for connecting to the equipment inside the housing and a second end for connecting to the equipment outside the housing;

microwave-absorbing material contained in the cavity of the connector body;

a conductive element passing through the connector body and partially embedded in the micro-wave absorbing material, the conductive element protruding from the microwave absorbing material at the first end of the connector body.

7. The connector according to claim 6, wherein the conductive element protrudes from the microwave absorbing material at the second end of the connector body.

8. The connector according to claim 7, further comprising additional conductive elements that pass through the connector body and that are partially embedded in the microwave absorbing material, the additional conductive elements protruding from the microwave absorbing material at both the first end and the second end of the connector body.

9. The connector according to claim 8, wherein the connector body includes a collar at the second end of the connector body, the collar having a groove open in a direction of the second end of connector body around the conductive element and additional conductive elements, and an electrically conductive gasket seated in the groove.

10. The connector according to claim 6, wherein the connector body is electrically conductive.

11. The connector according to claim 6, wherein the microwave material is silicone containing metal particles.

12. An equipment housing assembly, comprising:

a housing having equipment housed therein, and at an opening;

a connector mounted to the opening of the housing for electrically connecting the equipment housed in the housing to equipment outside the housing, said connector comprising:

a connector body defining a cavity therein, the connector body having a first end disposed inside the housing for connecting to the equipment housed in the housing and a second end disposed outside the housing for connecting to the equipment outside the housing;

microwave-absorbing material contained in the cavity of the connector body;

conductive elements passing through the connector body and partially embedded in the micro-wave absorbing material, the conductive elements protruding from the microwave absorbing material at the first end of the connector body.

13. The connector according to claim 12, wherein the conductive elements protrude from the microwave absorbing material at the second end of the connector body.

14. The connector according to claim 13, wherein the connector body includes a collar at the second end of the connector body, the collar having a groove open in a direction of the second end of connector body around the conductive element and additional conductive elements, and an electrically conductive gasket seated in the groove to form a seal between the connector and the housing.

15. The connector according to claim 12, wherein the connector body is electrically conductive.

16. The connector according to claim 12, wherein the microwave material is silicone containing metal particles.

* * * * *